United States Patent
Lee et al.

(10) Patent No.: US 7,977,966 B2
(45) Date of Patent: Jul. 12, 2011

(54) INTERNAL VOLTAGE GENERATING CIRCUIT FOR PREVENTING VOLTAGE DROP OF INTERNAL VOLTAGE

(75) Inventors: Kang-Seol Lee, Kyoungki-do (KR); Seok-Cheol Yoon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 497 days.

(21) Appl. No.: 11/528,643

(22) Filed: Sep. 28, 2006

(65) Prior Publication Data

US 2007/0069799 A1    Mar. 29, 2007

(30) Foreign Application Priority Data

Sep. 29, 2005  (KR) ......................... 10-2005-0091589
May 4, 2006    (KR) ......................... 10-2006-0040696

(51) Int. Cl.
*H03K 19/00* (2006.01)

(52) U.S. Cl. ........................................ 326/16; 365/201

(58) Field of Classification Search ............ 365/189.14, 365/201, 200, 222, 226; 324/158.1; 714/724; 327/536, 538; 363/60; 326/16
See application file for complete search history.

(56) References Cited

U.S. PATENT DOCUMENTS 6,347,381 B1 *  2/2002  McClure ......................... 714/30
7,307,896 B2 * 12/2007  Doyle et al. ............. 365/189.09

FOREIGN PATENT DOCUMENTS

JP    2002-197896       7/2007
KR    10-2001-0105442 A  11/2001

OTHER PUBLICATIONS

Korean Office Action issued in Korean Patent Application No. KR 2006-0040696 dated Apr. 30, 2007.

* cited by examiner

*Primary Examiner* — Jared J Fureman
*Assistant Examiner* — Daniel Cavallari
(74) *Attorney, Agent, or Firm* — IP & T Group LLP

(57) ABSTRACT

An internal voltage generating circuit is utilized to perform a TDBI (Test During Burn-in) operation for a semiconductor device. The internal voltage generating circuit produces an internal voltage at a high voltage level, as an internal voltage, in not only a standby section but also in an active section in response to a test operation signal activated in a test operation. Accordingly, dropping of the internal voltage in the standby section of the test operation and failure due to open or short circuiting are prevented. As a result, reliability of the semiconductor chip, by preventing the generation of latch-up caused by breakdown of internal circuits, is assured.

6 Claims, 6 Drawing Sheets

INTERNAL VOLTAGE GENERATING CIRCUIT FOR PREVENTING VOLTAGE DROP OF INTERNAL VOLTAGE

FIELD OF THE INVENTION

The present invention relates to a semiconductor device; and, more particularly, to an internal voltage generating circuit capable of performing a TDBI (Test During Burn-in) operation.

BACKGROUND

Generally, semiconductor manufacturing processes are classified into a pre-process which is called a batch fabrication process (FAB) and a post-process which is called a packaging/test process. The pre-process is to set up circuit devices in a silicon substrate through a plurality of processes, such as diffusion, photo, etching, ion-implantation and thin film processes. After testing the characteristics of each device, which is formed in a wafer by the pre-processes, the post-process includes performing a burn-in test as part of a final test on the unit device and includes the processes of sawing, bonding and molding the wafer by unit devices and a trim/form process. Here, the burn-in test is performed in order to increase the productivity of the final test. The burn-in test is carried out at a temperature of approximately 125° C. and a pattern test is thereafter carried out in a range of approximately 60° C. to 75° C. after the burn-in test. After lowering the temperature to a room temperature, the result of the test is sorted. The time required in the burn-in test may vary, depending on the use of the device. The equipment for semiconductor fabrication for the burn-in test is classified into first to third generation MBTs (Memory Burn-in Tester). The first generation MBT is a monitoring burn-in test capable of monitoring the burn-in results, the second generation MBT has a fast operation with a data management capability, and the third generation MBT is TDBI (Test During Burn-in) which includes the features of the first and second generation MBTs and further measures the characteristics of devices themselves.

As semiconductor chips become more and more integrated, each cell becomes more and more miniaturized. Due to the integration with small cell size, the operating voltage is also reduced. In case of the DRAM (Dynamic random access memory), an internal power supply is generated by an external power supply provided from an external circuit; however, the external power supply can undergo a variation in voltage level because of noise and other environmental effects. Therefore, an internal voltage generating circuit should be designed in order to generate a stable voltage regardless of the deterioration of the exterior voltage.

FIG. 1 is a block diagram of a conventional internal voltage generating circuit. Referring to FIG. 1, a band gap reference circuit 10 produces a power supply voltage Vbg which is insensitive to a PVT (Process, Voltage, and Temperature) fluctuation. This power supply voltage Vbg is applied to a reference voltage generating circuit 20 to generate a reference voltage Vref and an internal voltage generating circuit 60 generates an internal voltage based on the reference voltage Vref.

The internal voltage generating circuit 60 includes a standby internal voltage generating circuit 30, an active internal voltage generating circuit 40, and an internal voltage control circuit 50. The standby internal voltage generating circuit 30, which is always active during the standby and active operations, is employed to stabilize an early voltage level with a low drivability. The active internal voltage generating circuit 40 is designed to supply the large driving force needed in the active mode by a plurality of active internal voltage generating circuits that are formed to provide sufficient driving force. When the semiconductor device operates, the internal voltage control circuit 50 outputs an active signal Act to activate the active internal voltage generating circuit 40.

A plurality of the active internal voltage generating circuits 40 are employed in the semiconductor device and are respectively activated depending on the corresponding active signals Act.

FIG. 2 is a block diagram of the internal voltage generating circuit in FIG. 1. For the sake of convenience, a high voltage power supply VPP, which is used for activating a word line, is illustrated as one of the internal voltage sources in the semiconductor device.

As described above, when the semiconductor device operates, that is, when the semiconductor device is in an active mode, the active internal voltage generating circuit 40 operates in order to obtain a large amount of the driving force. A high voltage generating unit 40a in FIG. 2 corresponds to the active internal voltage generating circuit 40 in FIG. 1. On the other hand, the standby internal voltage generating circuit 30 illustrated in FIG. 1, which functions in the standby or active mode, corresponds to a standby internal high voltage generating circuit 30a in FIG. 2.

Referring to FIG. 2, a high voltage generating circuit 60a includes an internal voltage controller 50a and a high voltage generating unit 40a. Different internal control signals pwrup, ratv, rpcg and cke are activated in the active mode and input to the internal voltage controller 50a. To produce an active signal Act, the internal voltage controller 50a receives the power-up signal pwrup which is activated in the active mode, a RAS (Row Address Strobe) active signal ratv which is activated in a row active mode, a precharge signal rpcg which is activated in a precharge mode and a clock active signal cke for a low power operation.

The high voltage generating unit 40a includes a high voltage detecting unit 42a and a high voltage pumping unit 44a. A reference voltage Vref is applied to the high voltage detecting unit 42a and the high voltage detecting unit 42a is activated in response to the active signal Act. The high voltage pumping unit 44a, which receives an output signal PEE of the high voltage detecting unit 42a, carries out a charge pumping operation.

FIG. 3 is a circuit diagram of the high voltage detecting unit 42a of FIG. 2. Referring to FIG. 3, the high voltage detecting unit 42a includes resistors R1 and R2 for dividing a high voltage power supply VPP which is a feedback voltage from the high voltage pumping unit 44a, a comparator 46a having a current mirror amplifier structure operated in response to the active signal Act, and an inverter INV2 inverting an output signal of the comparator 46a.

The high voltage detecting unit 42a compares the divided voltage of the resistors R1 and R2 with the reference voltage Vref. When the divided voltage of the resistors R1 and R2 is higher than the reference voltage Vref, the high voltage detecting unit 42a outputs the output signal PEE with a high level. To the contrary, when the divided voltage of the resistors R1 and R2 is lower than the reference voltage Vref, the high voltage detecting unit 42a outputs the output signal PEE with a low level.

In other words, the active signal Act output from the internal voltage controller 50a of FIG. 2 activates the high voltage detecting unit 42a and the high voltage detecting unit 42a outputs the output signal PEE. The high voltage pumping unit 44a supplies the internal power, which is needed in the active mode, through the charge pumping operation in response to the output signal PEE.

FIG. 4 is a circuit diagram of the internal voltage controller of FIG. 2. Referring to FIG. 4, the internal voltage controller 50a includes: a PMOS transistor P1 having a gate to receive the power-up signal pwrup during the power-up operation; a PMOS transistor P2 to receive the precharge signal rpcg activated in the precharge mode; an inverter INV4 for receiving and inverting the RAS active signal ratv in the row active mode; an NMOS transistor Ni having a gate to receive an output signal of the inverter INV4; a latch circuit having two inverters INV5 and INV6 for latching a logic level on node Nod1; an inverter INV8 for receiving and inverting an output signal of the latch circuit; an inverter INV7 for receiving and inverting the clock active signal cke for the low power operation; and a NOR gate NOR2 to receive output signals of the inverter INV8 and the inverter INV7.

FIGS. 5A and 5B are timing charts illustrating the operating characteristics of the internal voltage controller 50a of FIG. 4. FIG. 5A is a timing chart illustrating the operating characteristics at the time of a normal operation. Referring to FIG. 5A, the active signal Act is kept in a high level in an active section in response to the internal control signals cke, ratv and rpcg. Thereafter, the activate signal Act is kept in a low level in a standby section in response to the transition of the precharge signal rpcg which goes from a low level to a high level. Therefore, the high voltage generating unit 40a of FIG. 2, which receives the active signal Act, is driven in the active section and does not function/operate in the standby section. The active section denotes a time period that the semiconductor device is active. The standby section denotes a time period that the semiconductor device is in a standby mode.

FIG. 5B is a timing chart illustrating the operating characteristics at the time of a test operation. Referring to FIG. 5B, the active signal Act is kept in a high level in the active section only at the time of the test operation. That is, the high voltage generating unit 40a does not operate in the standby section.

However, at the time of TDBI (Test During Burn-in) test operation, the repeated access at a high voltage and high temperature can cause a large amount of leakage current to exponentially increase and then cause a fast voltage drop of the internal voltage in the standby section in which the internal voltage is kept in a relatively low level. The fast dropping of the internal voltage produces greater leakage paths, causing the semiconductor device to be burned by the highly increased temperature or a O/S (Open/Short) failure. In this case, the breakdown of the internal elements is caused so that a latch-up phenomenon is created. As a result, it is impossible to perform the stable test operation and the reliability of the semiconductor chips deteriorates.

SUMMARY OF THE INVENTION

It is, therefore, an object of the present invention to provide an internal voltage generating circuit which is driven in a standby section at the test operation time, by generating different active signals output from the internal voltage controller based on a normal operation or a test operation.

In accordance with an aspect of the present invention, there is provided an internal voltage generating circuit of a semiconductor device comprising a standby internal voltage generating unit configured to generate an internal voltage in standby and active modes of a test operation; an internal voltage controlling unit configured to generate an active signal in response to an internal control signal and a test operation signal that is activated in the test operation; and an active internal voltage generating unit configured to produce the internal voltage in the standby and active modes of the test operation.

In accordance with another aspect of the present invention, there is provided a high voltage generating circuit of a semiconductor device comprising a standby internal voltage generating unit configured to generate a high voltage in standby and active modes of a test operation; a first internal voltage controlling unit configured to generate a control signal in response to an internal control signals; a second internal voltage controlling unit configured to generate an active signal in response to the control signal and a test operation signal that is activated in the test operation; and an active internal voltage generating unit configured to generate the high voltage in response to the active signal in the standby and active modes of the test operation.

In the present invention, an active internal voltage generator is driven not only in the active section but also in the standby section at the time of the test operation, by using a test operating signal output from a mode register set (MRS) at the time of the test operation, so that the internal voltage is prevented from being dropped in the standby section.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a semiconductor device for use in a semiconductor memory device in accordance with specific embodiments of the present invention will be described in detail with reference to the accompanying drawings.

Figure 6:
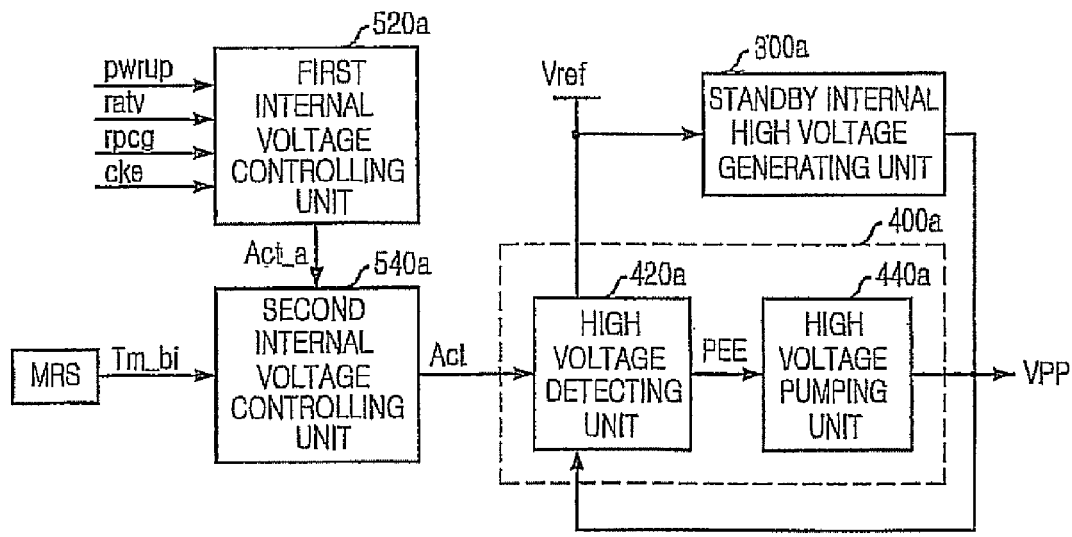
FIG. 6 is a block diagram of an internal voltage generating circuit according to the present invention.

FIG. 6 is a block diagram of an internal voltage generating circuit according to the present invention. For the sake of convenience, a high voltage generating unit 400a to produce a high voltage power supply VPP will be illustrated as an element to receive an active signal Act. That is, the high voltage generating unit 40a shown in FIG. 2 is shown as the high voltage generating circuit 400a in FIG. 6 and the standby internal high voltage generating unit which has been shown in FIG. 2 is shown as a standby internal high voltage generating unit 300a in FIG. 6.

Referring to FIG. 6, an internal voltage controlling unit 500a receives a power-up signal pwrup which is activated at the time of a power-up operation, a RAS active signal rats which is activated at the time of a low active operation, a precharge signal rpcg which is activated at the time of a precharge operation, a clock enable signal cke for a low power operation and a test operating signal Tm_bi which is output from a mode register set (MRS) at the time of a test operation. The internal voltage controlling unit 500a outputs the active signal Act for activating the high voltage generating unit 400a.

Figure 2:
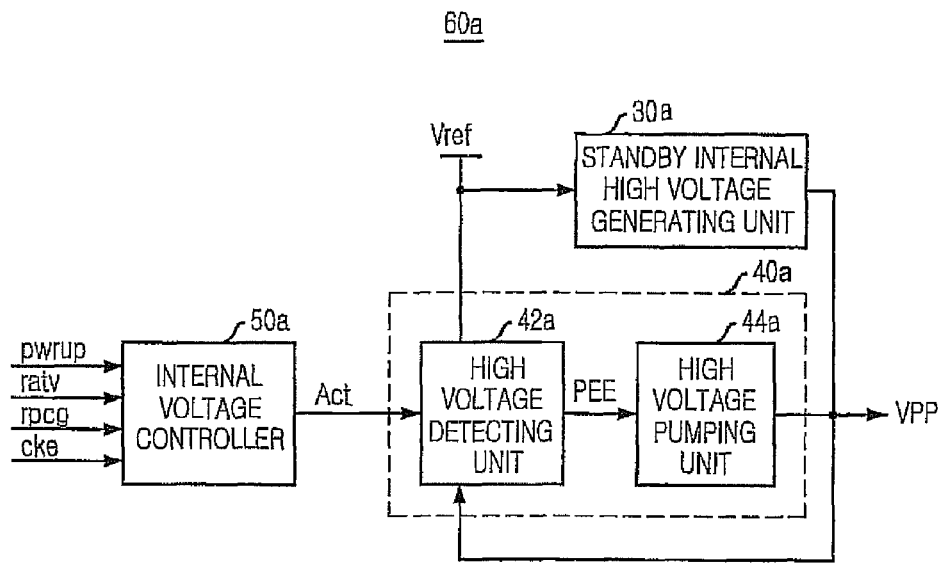
FIG. 2 is a block diagram of an internal voltage generating circuit in FIG. 1.

A high voltage detecting unit 420a in the high voltage generating unit 400a detects a potential level of the high voltage, as a feedback signal, which is activated by the active signal Act, and may have the same construction as the high voltage detecting unit 42a in FIG. 2 in that they both serve the same role, as also indicated by use of similar reference labels, of detecting the high voltage power supply VPP by using high voltage power supply VPP as a feedback voltage and are both responsive to active signal ACT in the overall circuit arrangement in FIGS. 2 and 6, respectively, there is no disclosure that they have different configurations despite having same input/output configurations and performing same feedback comparison operations, and thus, it would have been apparent to a skilled artisan that they can both be constructed in the same way. A high voltage pumping unit 440a, which receives an output signal PEE of the high voltage detecting unit 420a, produces a high voltage power supply VPP by carrying out a desired charge pumping operation.

Figure 4:
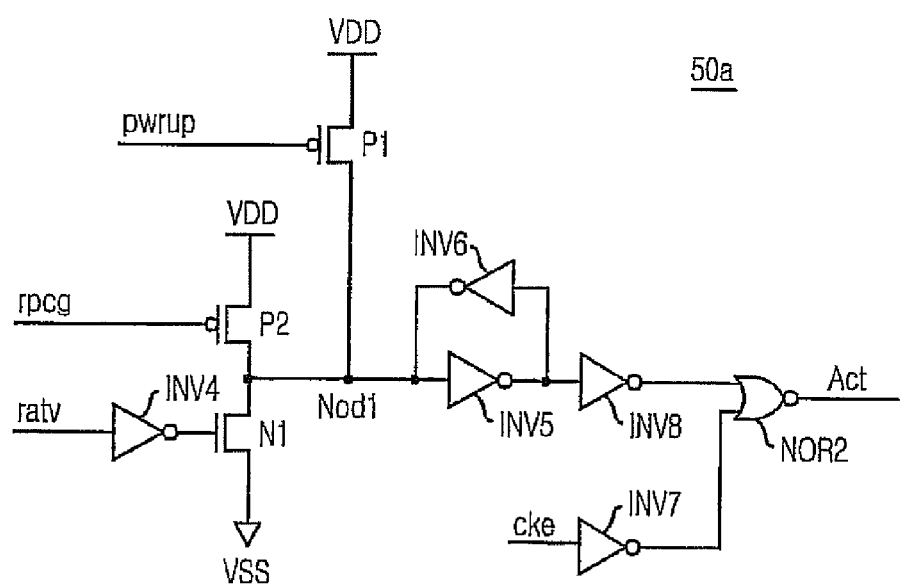
FIG. 4 is a circuit diagram illustrating the internal voltage controller of FIG. 2.
Figure 5A:
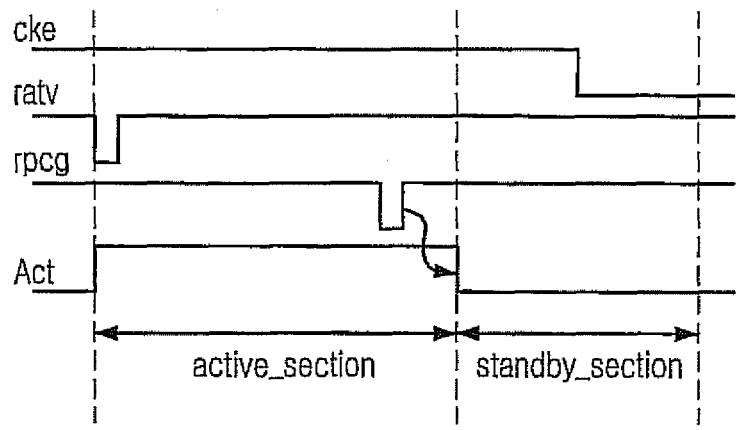
FIGS. 5A and 5B are timing charts illustrating the operating characteristics of the internal voltage controller of FIG. 4.
Figure 5B:
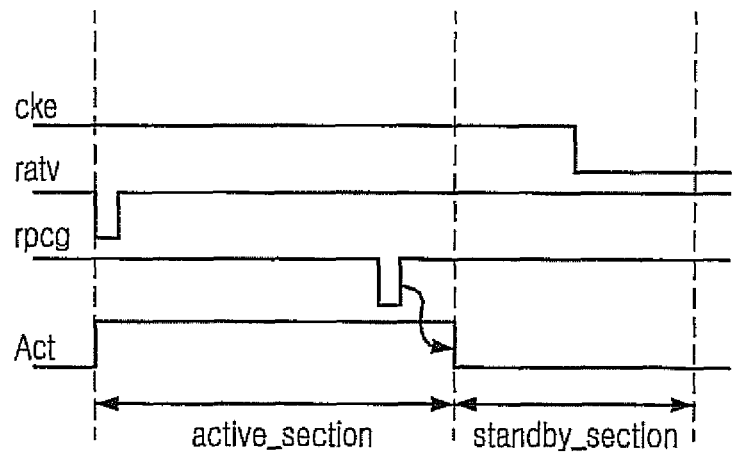
Figure 7:
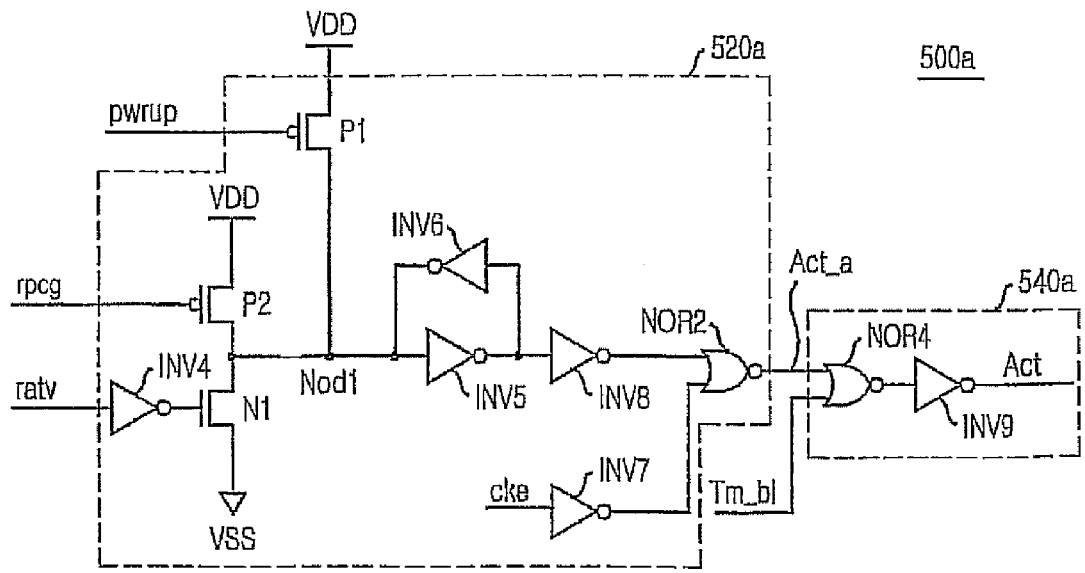
FIG. 7 is a circuit diagram of an internal voltage controller according to one embodiment of the present invention.

FIG. 7 is a circuit diagram of the internal voltage controlling unit 500a of FIG. 6 in accordance with one embodiment of the present invention and the same elements shown in FIGS. 4 and 7 are designated with the same reference numerals.

Referring FIG. 7, the internal voltage controlling unit 500a includes a first internal voltage controlling unit 520a, which receives internal control signals pwrup, ratv, rpcg and cke, and a second internal voltage controlling unit 540a into which an output signal of the first internal voltage controlling unit 520a and the test operation signal Tm_bi are input in order to output the active signal Act.

The first internal voltage controlling unit 520a includes: a first PMOS transistor P1 having a gate to receive the power-up signal pwrup during the power-up operation, being electrically connected between a power supply voltage and node 1; a second PMOS transistor P2 having a gate to receive the precharge signal rpcg activated in the precharge mode, being electrically connected between a power supply voltage VDD and node Nadi; a first inverter INV4 for receiving and inverting the RAS active signal rats in a row active mode; a first NMOS transistor N1 having a gate to receive and invert an output signal of the inverter INV4, being electrically connected between node 1 and a ground voltage level VSS; a latch circuit having two inverters INV5 and INV6 for latching a logic level on node Nod1; a second inverter INV7 for receiving and inverting the clock active signal cke for the low power operation; a third inverter INV8 for receiving and inverting an output signal from the latch circuit; and a first NOR gate NOR2 to receive output signals from both the third inverter INV8 and the second inverter INV7.

The latch circuit of the first internal voltage controlling unit 520a includes a fourth inverter INV5 having an input terminal which is connected to node Nod1 and a fifth inverter INV6 having an input terminal which is connected to an output terminal of the fourth inverter INV5 and an output terminal which is connected to node Nod1.

The second internal voltage controlling unit 540a includes a second NOR gate NOR4, which receives an output signal of the first voltage controlling unit 520a, i.e., a first active signal Act_a and the test operation signal Tm_bi, and a sixth inverter INV9 to invert an output signal of the second NOR gate NOR4.

Figure 8A:
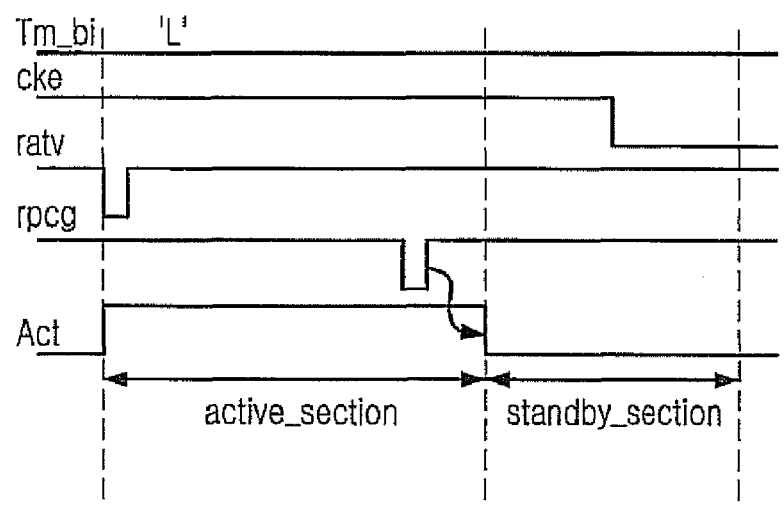
FIGS. 8A and 8B are timing charts illustrating the operation characteristics of the internal voltage controller of FIG. 7.
Figure 8B:
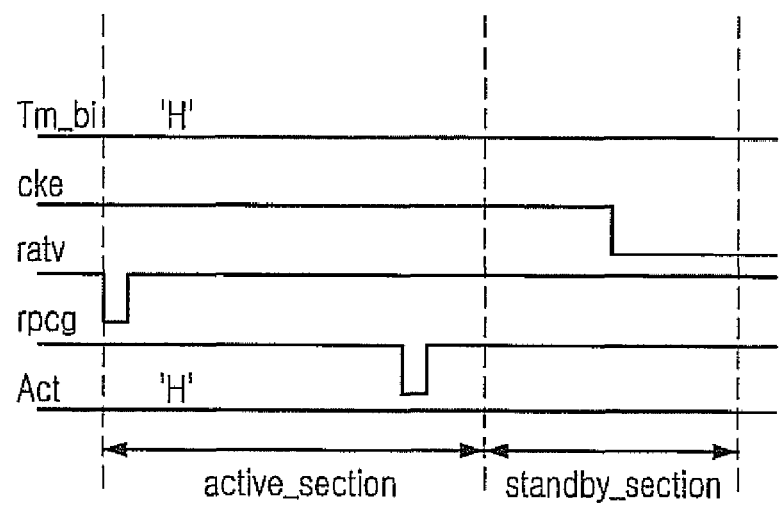

FIGS. 8A and 8B are timing charts illustrating the operation characteristics of the internal voltage controlling unit 500a of FIG. 7.

FIG. 8A is a timing chart illustrating the operation characteristics at the time of the normal operation. Referring to FIG. 8A, the test operation signal Tm_bi is kept in a low level at the time of the normal operation. The activate signal Act is kept in a high level in an active section in response to the internal control signal cke, rats and rpcg and thereafter is kept in a low level in a standby section in response to a rising edge of the precharge signal rpcg which goes from a low level to a high level. Therefore, the high voltage generating unit 400a of FIG. 6 that receives the active signal Act operates in the active section but does not operate in the standby interval. That is, the operation characteristics at the time of the normal operation of the present invention are the same as those at the time of the conventional operation.

FIG. 8B is a timing chart illustrating the operation characteristics at the time of the test operation. Referring to FIG. 8B, the test operation signal Tm_bi is kept at a high level at the time of the test operation. Accordingly, the active signal Act is at a high level based on the test operation signal Tm_bi. That is, since the active signal Act is always kept at a high level in the active and standby sections, the active internal voltage generating circuit (that is, the high voltage generating unit 400a of FIG. 6) is always driven in the active and standby sections at the time of the test operation.

Figure 1:
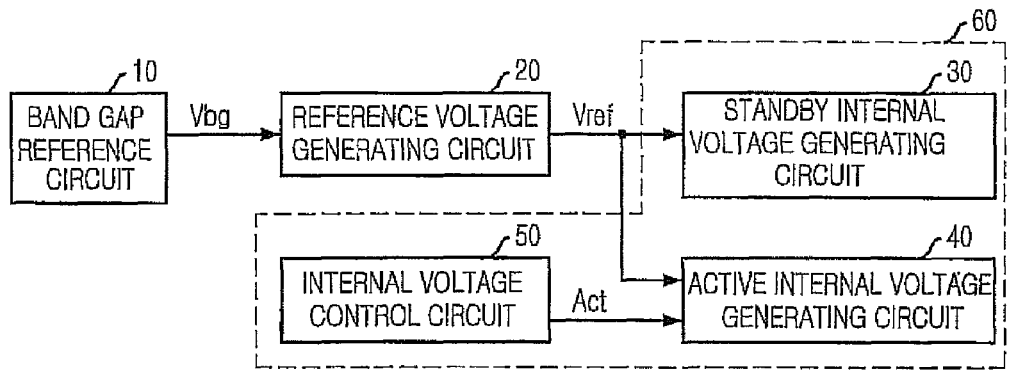
FIG. 1 is a block diagram of a conventional internal voltage generating circuit.
Figure 3:
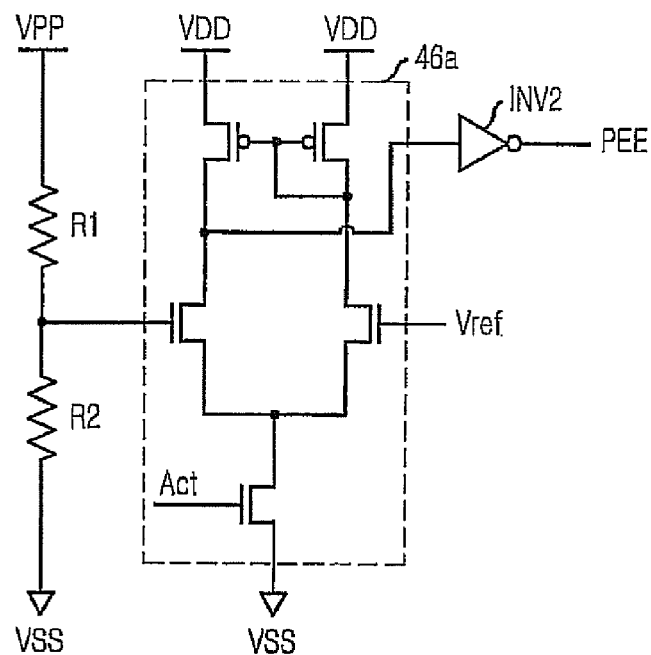
FIG. 3 is a circuit diagram of the high voltage detector of FIG. 2.
Figure 9:
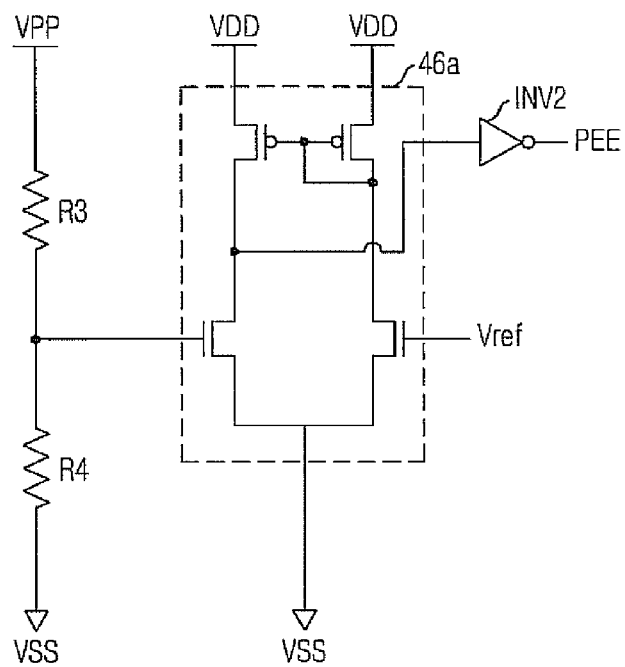
FIG. 9 is a circuit diagram illustrating a high voltage detecting circuit in the standby internal high voltage generating unit of FIG. 6, according to an exemplary embodiment of the invention.

FIG. 9 is a circuit diagram illustrating a high voltage detecting circuit 42b in the standby internal high voltage generating unit 300a of FIG. 6, where the standby internal high voltage generating unit 300a includes the high voltage detecting unit 42b and a high voltage pumping unit receiving an output signal from the high voltage detecting unit 42b, according to an exemplary embodiment of the invention. The operation of the high voltage detecting circuit 42b is the same as the high voltage detecting circuit 42a in FIG. 3 except as follows. The high voltage detecting circuit 42b does not receive the active signal Act in FIG. 3 and is turned on during both the normal operation and the test operation. Further, the high voltage detecting circuit 42b has resistors R3 and R4 having different resistances from those of the resistors R1 and R2 in FIG. 1 so that the output PEE in FIG. 9 is deactivated at a different voltage level of the high voltage power supply VPP than that for PEE deactivation in FIG. 3. For example, the output PEE in FIG. 9 may be deactivated at a lower different voltage level of the high voltage power supply VPP than that for the PEE deactivation in FIG. 3 so that the high voltage pumping unit of the standby internal high voltage generating unit 300a in FIG. 3 is deactivated at a lower level of the high voltage power supply VPP than the voltage level of the high voltage power supply VPP that the high voltage pumping unit 420a is deactivated at.

Figure 10:
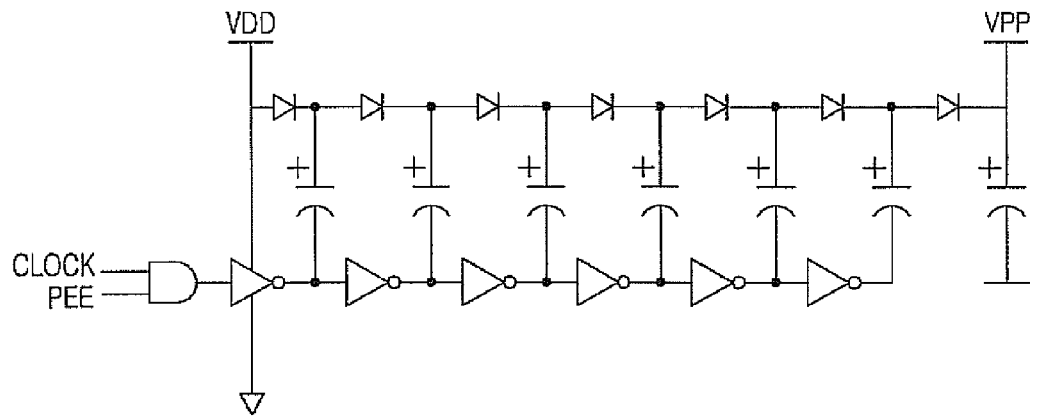
FIG. 10 is a circuit diagram illustrating a high voltage pumping unit for the high voltage pumping unit 440a or as the high voltage pumping unit in the standby internal high voltage generating unit 300a in FIG. 6, according to an exemplary embodiment of the invention.

FIG. 10 is a circuit diagram illustrating a high voltage pumping unit as the high voltage pumping unit 440a or as the high voltage pumping unit in the standby internal high voltage generating unit 300a in FIG. 6, according to an exemplary embodiment of the invention.

The high voltage pumping unit in FIG. 10 can be used to receive the output signal PEE of the high voltage detecting unit 420a in FIG. 6 or the high voltage detecting unit 42b in FIG. 9. The high voltage pumping unit receives the output signal PEE and a clock signal and outputs the clock signal through the AND gate illustrated in FIG. 10 only when the output PEE is activated.

In conclusion, even though the internal voltage of the internal voltage generating circuit suddenly drops in the standby section, the present invention prevents such a sudden drop of the internal voltage in the standby section by driving the active internal voltage generating circuit in not only the active sections but also the standby sections using the test operation signal Tm_bi.

As apparent from above, the present invention prevents the internal voltage from dropping in the standby section of the test operation and also prevents the semiconductor device from burning and a O/S (Open/Short) failure. As a result, the present invention secures the reliability of the semiconductor chip by preventing the generation of latch-up which is caused by breakdown of the internal circuits unit.

The present application contains subject matter related to the Korean patent applications Nos. KR 10-2005-0091589 and KR 10-2006-0040696, filed in the Korean Patent Office on Sep. 29, 2005 and on May 4, 2006 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. An internal voltage generating circuit of a semiconductor device, comprising:
a standby internal voltage generating unit configured to drive an internal voltage to a first voltage level;
an internal voltage controlling unit configured to generate an active signal in response to an internal control signal and a test operation signal, the test operation signal being activated in a test operation of the semiconductor device; and
an active internal voltage generating unit configured to selectively drive the internal voltage in response to the active signal and stop driving the internal voltage after detecting that the internal voltage reached a second voltage level different from the first voltage level during a normal operation of the semiconductor device and drive the internal voltage regardless of the active signal during the test operation,
wherein the internal voltage controlling unit includes:
a first internal voltage controlling unit configured to output a control signal in response to the internal control signal; and
a second internal voltage controlling unit configured to output the active signal in response to the control signal and the test operation signal.

2. A high voltage generating circuit of a semiconductor device, comprising:
a standby internal voltage generating unit configured to drive a high voltage to a first voltage level;
an internal voltage controlling unit configured to generate an active signal in response to an internal control signal and a test operation signal, the test operation signal being activated in a test operation of the semiconductor device,
wherein the internal voltage controlling unit includes:
a first internal voltage controlling unit configured to generate a control signal in response to the internal control signal, and
a second internal voltage controlling unit configured to generate the active signal in response to the control signal and the test operation signal; and
an active internal voltage generating unit configured to selectively drive the high voltage in response to the active signal and stop driving the high voltage after detecting that the high voltage reached a second voltage level different from the first voltage level during a normal operation of the semiconductor device and drive the internal voltage regardless of the active signal during the test operation.

3. The high voltage generating circuit in accordance with claim 2, wherein the active internal voltage generating unit includes:
a high voltage detecting unit configured to detect a potential level of the high voltage and generate a detecting signal corresponding to the detection result; and
a high voltage pumping unit configured to generate the high voltage in response to the detection signal.

4. An internal voltage generating circuit of a semiconductor device, comprising:
a first internal voltage controlling unit configured to output a control signal in response to internal control signals;
a second internal voltage controlling unit configured to output an active signal in response to the control signal and a test operation signal, the test operation signal being activated in a test operation of the semiconductor device; and
an active internal voltage generating unit configured to selectively drive an internal voltage in response to the active signal and stop driving the internal voltage by comparing the internal voltage with a first voltage level during a normal operation of the semiconductor device and drive the internal voltage regardless of the active signal during the test operation of the semiconductor device.

5. The internal voltage generating circuit in accordance with claim 4, further comprising a standby internal voltage generating unit configured to drive the internal voltage to a second voltage level different from the first voltage level.

6. The internal voltage generating circuit in accordance with claim 4, wherein the active internal voltage generating unit comprises:
a voltage detecting unit configured to detect a potential level of the internal voltage, and generate a detecting signal corresponding to the detection result; and
a voltage pumping unit configured to generate the internal voltage in response to the detection signal.

* * * * *